United States Patent [19]
Wen et al.

[11] Patent Number: 5,252,841
[45] Date of Patent: Oct. 12, 1993

[54] HETEROJUNCTION BIPOLAR TRANSISTOR STRUCTURE HAVING LOW BASE-COLLECTOR CAPACITANCE, AND METHOD OF FABRICATING THE SAME

[75] Inventors: Cheng P. Wen, Mission Viejo; Chan S. Wu, Torrance; Peter Chu, Hawthorne, all of Calif.

[73] Assignee: Hughes Aircraft Company, Los Angeles, Calif.

[21] Appl. No.: 6,189

[22] Filed: Jan. 19, 1993

Related U.S. Application Data

[63] Continuation of Ser. No. 697,379, May 9, 1991, abandoned.

[51] Int. Cl.[5] .................. H01L 29/161; H01L 29/205; H01L 29/72
[52] U.S. Cl. .................................... 257/197; 257/586; 257/587; 257/577
[58] Field of Search .................... 357/16, 34; 257/197, 257/577, 586, 587

[56] References Cited

U.S. PATENT DOCUMENTS 4,380,774  4/1983  Yoder ..................... 357/34

FOREIGN PATENT DOCUMENTS

| | | | |
|---|---|---|---|
| 60-7771 | 1/1985 | Japan | 357/34 |
| 61-182257 | 8/1986 | Japan | 357/34 |
| 63-318778 | 12/1988 | Japan | 357/34 |
| 1-233770 | 9/1989 | Japan | 357/34 |

OTHER PUBLICATIONS

"High-Performance AlGaAs/GaAs HBT's Utilizing Proton-Implanted Buried Layers and Highly Doped Base Layers", Nakajima et al. *IEEE Trans on Elect. Dev.* Dec. 1987 pp. 2393-2395.

*Primary Examiner*—Andrew J. James
*Assistant Examiner*—Donald L. Monin, Jr.
*Attorney, Agent, or Firm*—Georgann S. Grunebach; Terje Gudmestad; W. K. Denson-Low

[57] ABSTRACT

The base-collector capacitance in a heterojunction bipolar transistor (HBT) (50) is reduced, thereby providing increased cutoff frequency and power gain, by eliminating a portion of a collector contact layer (54) which normally underlies a base electrode (66). A similar effect may be produced by forming the collector contact layer (54) such that it initially extends into the area (54c) under the base electrode (66), and subsequently rendering the collector contact layer (54) in this area (54c) semiinsulative by proton bombardment. A ballast resistor layer (70) is formed between an emitter layer (62) and an overlying emitter electrode (68) to prevent thermal runaway and hot spot formation. A plurality of the HBTs (50) may be arranged in a distributed amplifier configuration (80) including contact electrode bus lines (84,88) having a geometry designed to provide high thermal efficiency, and input and output circuit matching characteristics.

25 Claims, 4 Drawing Sheets

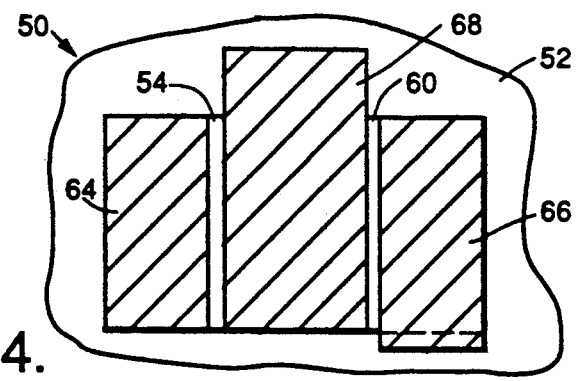
FIG. 4.
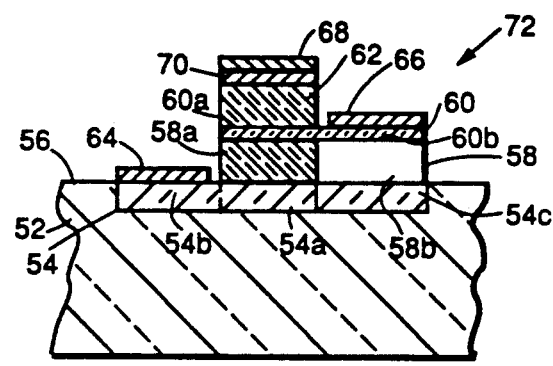
FIG. 5.
FIG. 6.
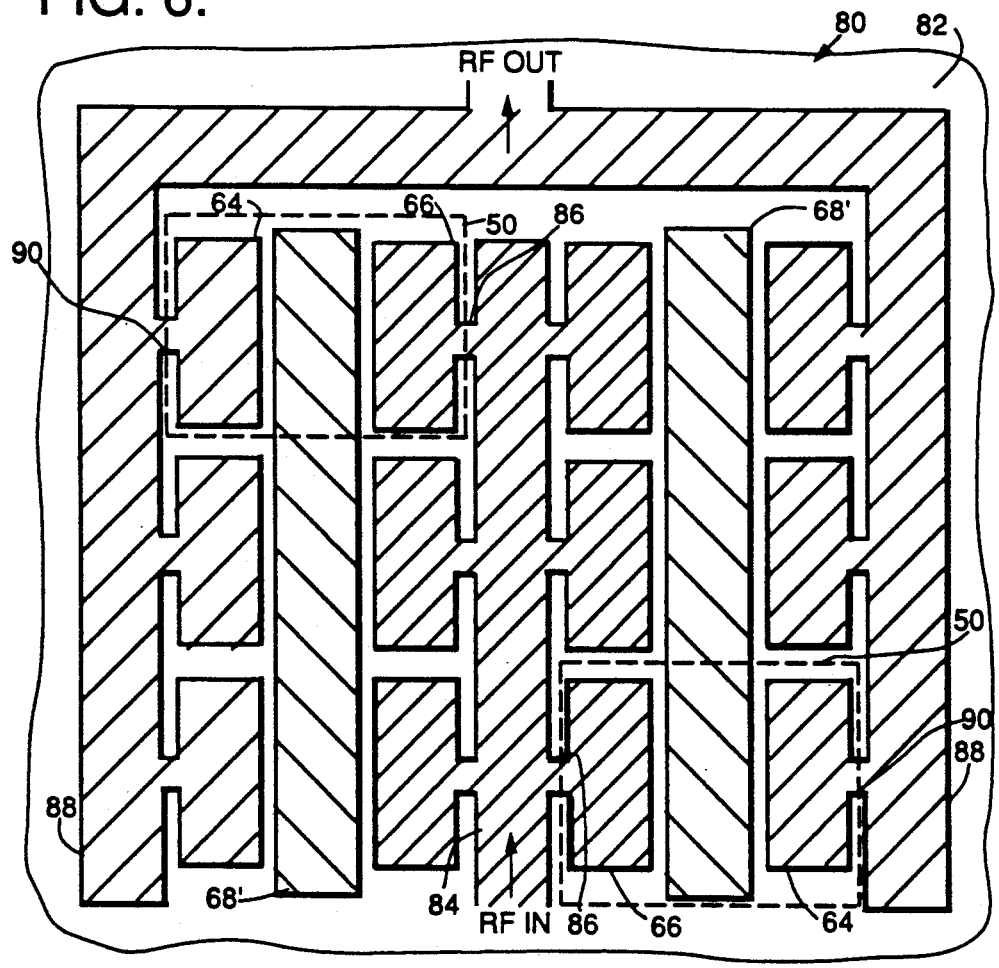

HETEROJUNCTION BIPOLAR TRANSISTOR STRUCTURE HAVING LOW BASE-COLLECTOR CAPACITANCE, AND METHOD OF FABRICATING THE SAME

This is a continuation of application Ser. No. 07/697,379 filed May 9, 1991, now abandoned.

BACKGROUND OF THE INVENTION

1. Field of the Invention

The present invention relates to the fabrication of an improved heterojunction bipolar transistor (HBT) structure for microwave power amplification.

2. Description of the Related Art

HBT's have been demonstrated to provide microwave power amplification more efficiently than metal-semiconductor field effect transistors (MESFETs) and high-electronmobility transistors (HEMTs). HBT microwave amplifiers offer high power density, sharp current cutoff, and negligible degradation in voltage breakdown characteristics when operated in class B or C high efficiency modes. The high power density of an HBT results in smaller device footprint, improved power combining efficiency, and smaller microwave monolithic integrated circuit (MMIC) chip size compared with a field effect transistor (FET) operating at the same power level.

The heterojunction nature of the HBT device structure is further compatible with material-composition-dependent self-termination (stop etch) wafer processing techniques. This, combined with the relatively coarse lithographic requirements (typically over 1.5 micron geometry compared with sub-0.5 micron geometry required for MESFETs operating at X-band frequencies and above), enable significant manufacturing yield improvement and cost reduction over that of conventional FET based MMICs.

The HBT features a heterojunction including a gallium arsenide (GaAs) base and wider bandgap aluminum gallium arsenide (AlGaAs) emitter which presents a potential barrier to hole flow from the base to emitter. This provides higher emitter efficiency than can be achieved in a conventional silicon based homojunction bipolar transistor structure. The base resistance can be reduced by heavy doping without sacrificing emitter efficiency. The frequency response of an HBT is higher than can be achieved with conventional bipolar transistors due to higher current gain and lower base resistance. However, the performance of HBTs operating at microwave frequencies is degraded by the base-collector capacitance of the device, especially in the grounded-emitter amplifier configuration. The large base-collector capacitance causes undesirable feedback and premature gain roll-off at elevated signal frequencies, limiting both amplifier efficiency and the upper limit of operating frequency.

A conventional HBT is described in an article entitled "Microwave Performances of NPN and PNP AlGaAs/GaAs Heterojunction Bipolar Transistors", by B. Bayraktaroglu et al, in 1988 IEEE MTT-S Digest, pp. 529-532, and has the structure illustrated in FIG. 1. The HBT as shown is an NPN device which is generally designated as 10, and includes a substrate 12 formed of GaAs or other semiinsulating material. A collector contact layer 14 is formed on a surface 16 of the substrate 12, preferably by ion implantation into the surface 16 as illustrated, or by epitaxy onto the surface 16 (not shown). For an NPN HBT, the collector contact layer 14 will be doped with an N-type impurity.

A collector layer 18 of GaAs doped with an N-type impurity is formed over the central portion of the collector contact layer 14. A base layer 20 of GaAs which is doped with a P-type impurity is formed over the collector layer 18. An emitter layer 22 of AlGaAs doped with an N-type impurity is formed over the central portion of the base layer 20.

The layers 18, 20 and 22 are deposited on the substrate 12 using molecular beam epitaxy (MBE), metal organic chemical vapor deposition (MOCVD), or other suitable process, and subsequently etched to form the structure as illustrated. Collector ohmic contact metallizations or electrodes 24 are formed over the exposed laterally outer portions of the collector contact layer 14, preferably of gold/germanium (Au/Ge) or other electrically conductive metal or alloy. The heavily doped collector contact layer 14 and collector electrodes 24 provide electrical connection of a central active area 18a of the collector layer 18 to external devices (not shown). Base ohmic contact metallizations or electrodes 26 are similarly formed over the exposed laterally outer portions of the base layer 20, and an emitter ohmic contact metallization or electrode 28 is formed over the emitter layer 22.

The base-collector capacitance of the HBT 10 includes the depletion capacitance between the base layer 20 and collector layer 18, and the parasitic capacitance between the base layer 20 and collector contact layer 14. The depletion capacitance may be reduced by proton bombardment, prior to formation of the electrodes 24, 26 and 28, in areas 18b of the collector layer 18 laterally external of the emitter layer 22 to create a wider depletion layer.

However, the parasitic capacitance between the heavily doped base layer 20 and collector contact layer 14 in the areas 18b remains, and constitutes nearly 80% of the total base-collector capacitance in a typical HBT with 2 micrometer wide emitter fingers and one micrometer wide base contact layers. This undesired base-collector capacitance deleteriously limits the cutoff frequency and power gain of the HBT 10.

The base-collector capacitance may be reduced by using a "collector-up" HBT configuration as illustrated in FIG. 2. An HBT 30 includes a GaAs substrate 32, ion implanted or epitaxially grown AlGaAs emitter contact layer 34 formed on a surface 36 of the substrate 32, AlGaAs emitter layer 38, GaAs base layer 40, GaAs collector layer 42, emitter electrodes 44, base electrodes 46, and a collector electrode 48 as illustrated. The emitter layer 38 has a central active portion 38a, and outer portions 38b which are rendered semi-insulative by proton bombardment as described above. The HBT 30 differs from the HBT 10 in that the relative positions of the emitter and collector are reversed, with the collector layer 42 being above the emitter layer 38 in the HBT 30.

The base-collector capacitance is reduced in the HBT 30 due to the smaller width of the collector layer 42 compared to the collector layer 18 in the "emitter-up" HBT 10, thus improving the high frequency device characteristics. However, access to the thin base layer 40, which is typically less than 1,000 Angstroms thick, can only be accomplished by removing the overlying portions of the relatively thick collector layer 42. The manufacturing yield can be severely reduced by a small variation in the etch rate, or in the uniformity of the etch rate during the formation of the base electrodes 26. Incomplete removal of the collector material or overetching of the base material will cause high base resistance and consequent degradation of the HBT performance characteristics.

SUMMARY OF THE INVENTION

In a heterojunction bipolar transistor embodying the present invention, a semiconductive collector contact layer is formed on a substrate, including a first portion, and a second portion which is laterally spaced from the first portion. A collector layer includes a semiconductive first portion formed over the first portion of the collector contact layer, and a lattice damaged second portion formed over the substrate which is laterally spaced from the first portion of the collector layer and from the collector contact layer. A collector electrode is formed over the second portion of the collector contact layer. A semiconductive base layer includes a first portion formed over the first portion of the collector layer, and a second portion formed over the second portion of the collector layer. A semiconductive emitter layer is formed over the first portion of the base layer. A base electrode is formed over the second portion of the base layer, and an emitter electrode is formed over the emitter layer.

The base-collector capacitance in the present HBT is reduced, thereby providing increased cutoff frequency and power gain, by eliminating a portion of the collector contact layer which normally underlies the base electrode. A similar effect may be produced by forming the collector contact layer such that it initially extends into the area under the base electrode, and subsequently rendering the collector contact layer in this area semi-insulative by proton bombardment. A ballast resistor layer may be formed between the emitter layer and overlying emitter electrode to prevent thermal runaway and hot spot formation. A plurality of the HBTs may be arranged in a distributed amplifier configuration including contact electrode bus lines having a geometry designed to provide high thermal efficiency, and input and output circuit matching characteristics.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 4 is a plan view of the HBT illustrated in FIG. 3;

FIG. 5 is a sectional view illustrating another HBT embodying the present invention;

FIG. 6 is a plan view illustrating a distributed amplifier incorporating a plurality of the HBTs shown in FIGS. 3 or 5;

DETAILED DESCRIPTION OF THE INVENTION

Figure 3:
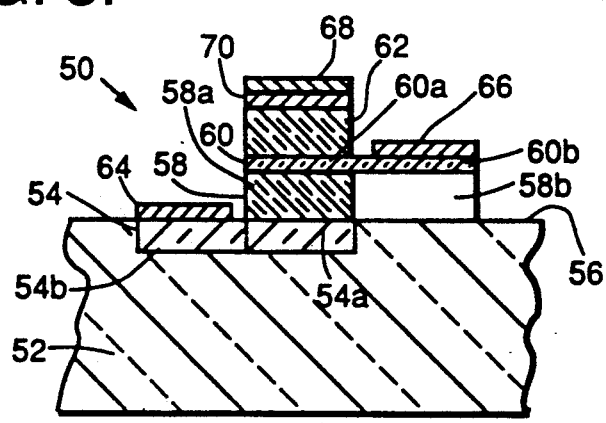
FIG. 3 is a sectional view illustrating an HBT embodying the present invention.

Referring now to FIGS. 3 and 4, an NPN HBT embodying the present invention is generally designated as 50, and includes a substrate 52 formed of GaAs or other semiinsulating material. An N-doped semiconductive collector contact layer 54 is formed on a surface 56 of the substrate 52, preferably by ion implantation. The collector contact layer 54 includes a first portion 54a, and a second portion 54b which is laterally spaced from the first portion 54a.

A collector layer 58 of N-doped GaAs is formed over the surface 56 of the substrate 52, and includes a semiconductive active area or first portion 58a which overlies the first portion 54a of the collector contact layer 54, and lattice damaged second portion 58b which is laterally spaced from the first portion 58a. In accordance with the present invention, the second portion 58b of the collector layer 58 is also laterally spaced from the collector contact layer 54.

A P-doped semiconductive base layer 60 of GaAs is formed over the collector layer 18, and includes a first portion 60a which overlies the first portion 58a of the collector layer 58, and a second portion 60b which overlies the second portion 58b of the collector layer 58. An N-doped semiconductive emitter layer 62 of AlGaAs is formed over the first portion 60a of the base layer 60.

A single collector ohmic contact metallization or electrode 64 is formed of gold or the like over the second portion 54b of the collector contact layer 54. A single base ohmic contact metallization or electrode 66 is formed over the second portion 60b of the base layer 60. An emitter ohmic contact metallization or electrode 68 is formed over the emitter layer 62. It will be understood that the present invention is applicable to a PNP configuration, as well as the NPN configuration described above.

If desired, a ballast resistor layer 70 may be formed between the emitter layer 62 and emitter electrode 68. The layer 70 is preferably formed of GaAs and doped, in an NPN configuration, with an N-type impurity. The ballast resistor layer 70 prevents thermal runaway and the formation of hot spots.

Figure 1:
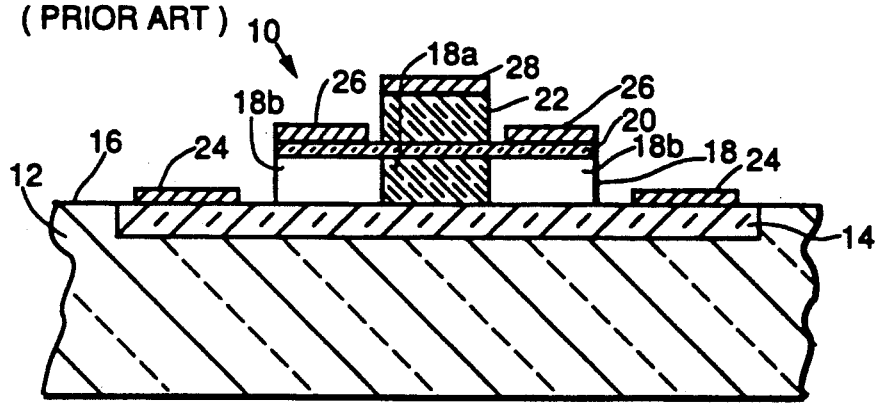
FIGS. 1 and 2 are sectional views illustrating prior art HBTs.
Figure 2:
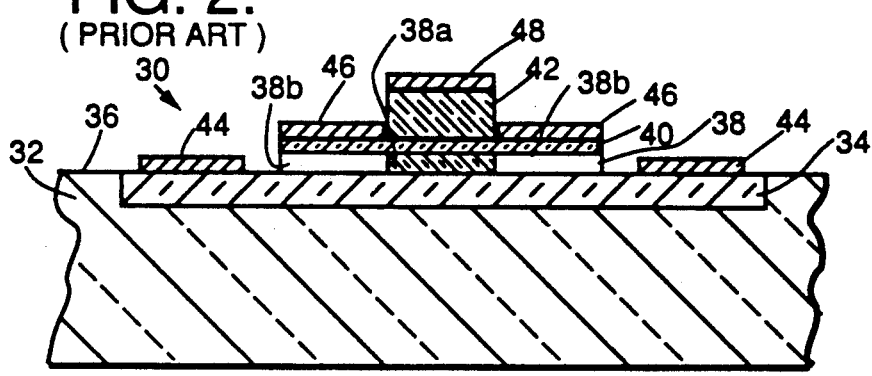

In accordance with the present invention, the collector contact layer 54 extends only under the active area or first portion 58a of the collector layer 58. The base layer 60 and collector contact layer 54 thereby overlap only across the active area 58a, as is necessary for the operation of the HBT 50. There is no overlap between the base layer 60 and collector contact layer 54 in non-active areas as exemplified by the areas 18b of the collector layer 18 in the prior art HBT 10 shown in FIG. 1, thereby reducing the base-collector capacitance to the lowest possible value. Due to the extremely heavy doping of the base layer 60, sufficiently low base contact resistance can be achieved with only the single base electrode 66 on one side of the emitter layer 62.

Elimination of overlap between the base layer 60 and collector contact layer 54 in areas which are not required for device operation provides the HBT 50 with greatly reduced base-collector capacitance, and increased cutoff frequency and power gain compared with the conventional configuration.

FIG. 5 illustrates a modified HBT embodying the present invention which is generally designated as 72. The HBT 72 is similar to the HBT 50 except for the presence of an extension 54c of the collector contact layer 54 which extends laterally from the first portion 54a and underlies the second portion 58b of the collector layer 58. The extension 54c is lattice damaged through bombardment with protons or other particles at the same time as the overlying second portion 58b of the collector layer 58, and thereby rendered semi-insulative. Although a small amount of undesired capacitance may exist between the lattice damaged extension 54c and the second portion 58b of the base layer 58, this capacitance is much lower than if the extension 54c were semiconductive as with the portions 18b of the collector contact layer 18 in the prior art HBT 10.

FIG. 6 illustrates a distributed amplifier 80 embodying the present invention fabricated on a substrate 82, incorporating six of the HBTs 50 (or alternatively the HBTs 72) in a distributed cell configuration which is especially suited to MMIC fabrication technology. For simplicity of illustration, the individual elements of only two of the HBTs 50 shown as enclosed by broken lines are designated by reference numerals. The elements of the other HBTs 50 are essentially similar.

The amplifier 80 includes an input bus 84 for receiving a microwave input signal RF IN. The bus 84 is connected to the base electrodes 66 of all of the HBTs 50 by base connector striplines 86. In a similar manner, a bifurcated output bus 88 is connected to the collector electrodes 64 of all of the HBTs 50 through collector connector striplines 90. The amplifier 80 provides a microwave output signal RF OUT via the output bus 88. The emitter electrodes 68 of each set of three vertically aligned HBTs 50 (as viewed in FIG. 6) extend into interconnection with each other to form two emitter busses which are designated as 68'. In a grounded emitter amplifier configuration, the busses 68' will be connected to a ground plane (not shown) of the substrate 82.

The distributed amplifier 80 enables broad bandwidth operation due to input and output signal matching, in addition to efficient thermal power dissipation. Each of the busses 84, 68' and 88 and striplines 86 and 90 has inductance and capacitance. The geometry of the busses 84, 68' and 88 and striplines 86 and 90 is designed such that the microwave signal RF IN propagates along the busses with a substantially constant phase velocity. This is made possible by optimally selecting the shape of the busses 84, 68' and 88 such that the inductance and capacitance thereof provide input and output matching for the propagating electromagnetic wave.

The optimization of a distributed amplifier configuration is known in the art per se, and is not the subject matter of the present invention. An example of a typical distributed amplifier design relevant to the present invention is described in an article entitled "COPLANAR WAVEGUIDES USED IN 2-18 GHz DISTRIBUTED AMPLIFIER", by M. Riaziat et al, in 1986 IEEE MTT-S Digest, pp. 337-338.

Figure 7:
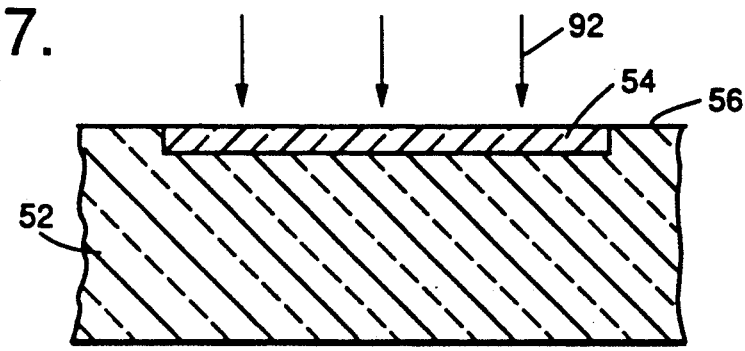
FIGS. 7 to 9 are sectional views illustrating the fabrication of the HBT shown in FIGS. 3 and 4.
Figure 8:
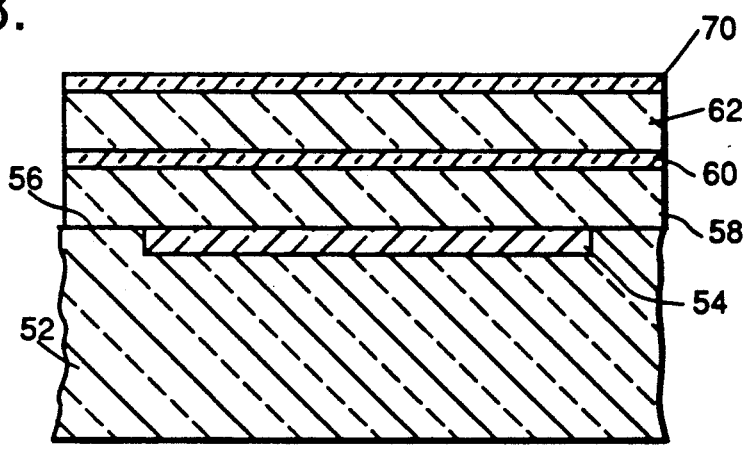
Figure 9:
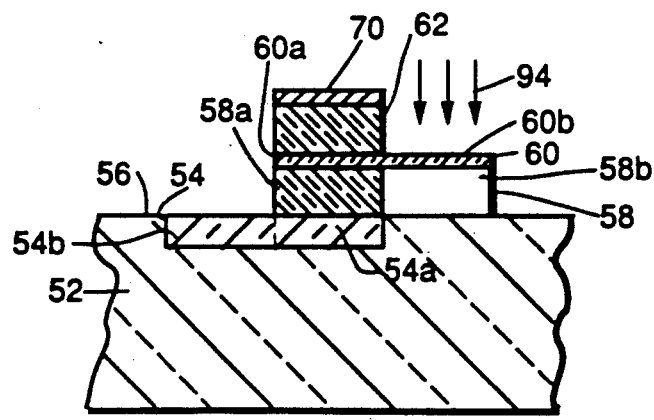

A method of fabricating the HBT 50 shown in FIGS. 3 and 4 in accordance with the present invention is illustrated in FIGS. 7 to 9. In FIG. 7, the collector contact layer 54 is formed in the surface 56 of the substrate 52 by selective ion implantation as indicated by arrows 92. The layer 54 is typically implanted to a depth of several thousand Angstroms. Where the HBT 50 is based on GaAs, the collector contact layer 54 will be heavily doped with an N-type impurity such as silicon to a concentration on the order of $2-5 \times 10^{18}$ atoms/cm$^3$.

As illustrated in FIG. 8, the collector layer 58 is formed of GaAs doped with an N-type impurity to a concentration of approximately $3 \times 10^{16}$ atoms/cm$^3$ and to a thickness of approximately 7,000-10,000 Angstroms over the substrate 52. The base layer 60 is formed of GaAs which is heavily doped with a P-type impurity such as zinc or carbon to a concentration of approximately $10^{19}-10^{20}$ atoms/cm$^3$ and to a thickness of 700-1,000 Angstroms over the collector layer 58. The emitter layer 62 is formed of AlGaAs doped with an N-type impurity to a concentration of approximately $3-5 \times 10^{17}$ atoms/cm$^3$ and to a thickness of a few thousand Angstroms over the base layer 60. The ballast resistor layer 70 is formed of GaAs over the emitter layer 62 and doped with an N-type impurity to a concentration on the order of $10^{16}-10^{17}$ atoms/cm$^3$. The thickness of the layer 70 is selected to provide a desired value of electrical resistance, which may vary considerably depending on the particular application.

Although not specifically shown in the drawing, a heavily doped GaAs ohmic contact layer may be formed between the ballast resistor layer 70 and emitter electrode 68. Such a layer, where provided, will be approximately 1,000-2,000 Angstroms thick and doped with an N-type impurity to a concentration of at least $10^{18}$ atoms/cm$^3$.

The layers 58, 60, 62 and 70 are deposited on the substrate 12 using molecular beam epitaxy (MBE), metal organic chemical vapor deposition (MOCVD), or other suitable process, and subsequently etched using conventional methods to form the structure as illustrated in FIG. 9. The second portion 58b of the collector layer 58 is then bombarded with protons through the overlying second portion 60b of the base layer 60 as indicated at 94 to damage the lattice structure in the portion 58b and render it semiinsulative.

An appropriate surface dosage for proton bombardment is $10^{13}-10^{14}$ protons/cm$^2$ at an energy level of approximately 150 KeV, assuming that the dopant concentration in the collector layer 58 is below approximately $5 \times 10^{16}$ electrons/cm$^3$. The base layer 60, which is much more heavily doped than the collector contact layer 54, will remain highly conductive for low resistance base ohmic contact formation even after proton bombardment if the energy and dosage are appropriately selected. Alternatively, bombardment may be performed using particles such as hydrogen (H) atoms, oxygen (O) atoms, or P-type dopant atoms such as boron (B) where it is desired to decrease the net carrier concentration of the collector layer 18.

The collector electrode 64, base electrode 66 and emitter electrode 68 are then formed using conventional metallization and ohmic metal alloying techniques to provide the HBT structure 50 illustrated in FIG. 3. Although not shown, a dielectric passivation layer and other desired elements may be additionally formed as desired.

Figure 10:
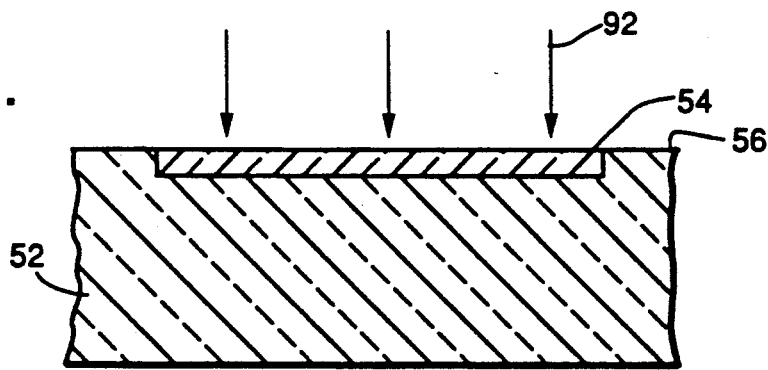
FIGS. 10 to 12 are sectional views illustrating the fabrication of the HBT shown in FIG. 5.
Figure 11:
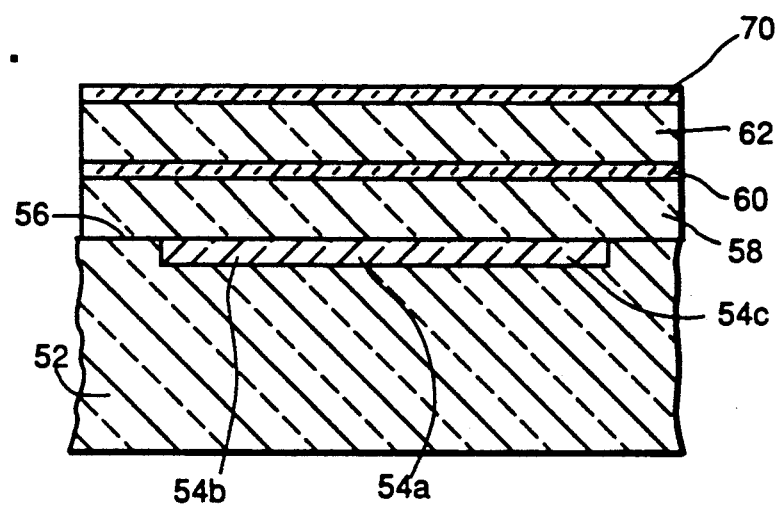
Figure 12:
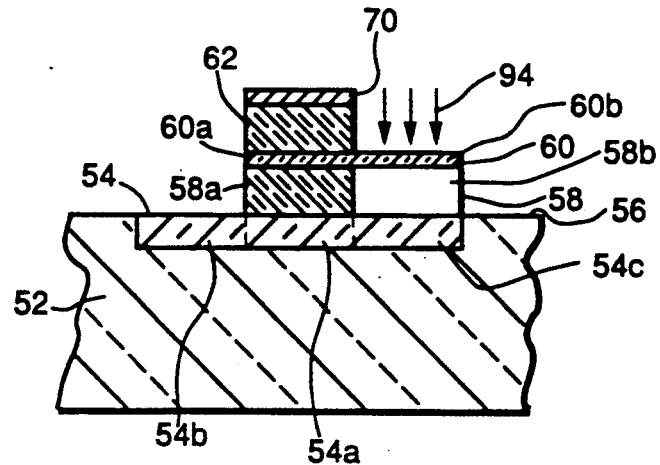

A method of fabricating the HBT 72 illustrated in FIG. 5 is shown in FIGS. 10 to 12. In FIG. 10, the collector contact layer 54, including the extension 54c, is formed in the surface 56 of the substrate 52 by selective ion implantation as indicated by the arrows 92. As illustrated in FIG. 11, the layers 58, 60, 62 and 70 are deposited on the substrate 12 and subsequently etched to form the structure as illustrated in FIG. 12.

The second portion 58b of the collector layer 58 and underlying extension 54c of the collector contact layer are then bombarded with protons through the overlying second portion 60b of the base layer 60 as indicated at 94 to damage the lattice structure in the portion 58b and extension 54c and render them semi-insulative. The same surface density for proton bombardment described above with reference to FIG. 9 is suitable for the step of FIG. 12. However, the bombardment will be performed for a longer period of time to enable penetration and lattice damage of the extension 54c. The collector electrode 64, base electrode 66 and emitter electrode 68 are then formed to provide the HBT structure 72 illustrated in FIG. 5.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A heterojunction bipolar transistor, comprising:
    a semi-insulating substrate;
    a doped, semiconductive, collector contact layer formed in the surface of said semi insulating substrate;
    a doped, collector layer including a semiconductive, electrically active region formed over and in contact with said doped, semiconductive, collector contact layer, and a semi-insulative, electrically inactive region abutting said electrically active region of said doped, collector layer said semi-insulative electrically inactive region of said collector layer, formed over and in contact with an undoped region of the semi-insulating substrate;
    a collector electrode formed over and in contact with said collector contact layer;
    a semiconductive base layer including; a first electrically active region formed over said electrically active region of said collector layer, and a second electrically active region abutting said first electrically active region of said semiconductive base layer formed over and in contact with said semi-insulative electrically inactive region of said collector layer;
    a semiconductive emitter layer formed over and in contact with said first electrically active region of said base layer;
    a base electrode formed over and in contact with said second electrically active region of said base layer; and
    an emitter electrode formed over and in contact with said semiconductive emitter layer.

2. A transistor as in claim 1, in which the collector contact layer is implanted into the substrate.

3. A heterojunction bipolar transistor as in claim 1, further comprising a extension of collector contact layer extending laterally from under said said collector contact layer under said electrically inactive region of said collector layer.

4. A transistor as in claim 3, in which the collector contact layer and extension are implanted into the substrate.

5. A transistor as in claim 1, further comprising a ballast resistor layer formed between the emitter layer and the emitter contact layer.

6. A transistor as in claim 1, in which the substrate, collector contact layer, collector layer and base layer are formed of gallium arsenide, and the emitter layer is formed of aluminum gallium arsenide.

7. A transistor as in claim 6, further comprising a ballast resistor layer formed of gallium arsenide between the emitter layer and emitter contact layer.

8. A doped, semiconductive, collector contact layer as in claim 1 wherein said electrically active region is conductive.

9. A doped, semiconductive, collector contact layer as in claim 1 wherein said electrically active region is capacitatively coupled to said base layer.

10. A doped, collector layer as in claim 1 wherein said semiconductive, electrically active region is conductive.

11. A doped, collector layer as in claim 1 wherein said semiconductive, electrically active region is capacitatively coupled to said base layer.

12. A semiconductive, base layer as in claim 1 wherein said first electrically active region is conductive.

13. A semiconductive, base layer as in claim 1 wherein said first electrically active region is capacitatively coupled to said collector contact layer.

14. A semiconductive, base layer as in claim 1, wherein said second electrically active region is conductive.

15. A semiconductive, base layer as in claim 1, wherein said second electrically active region is capacitatively coupled to said collector layer.

16. A distributed amplifier, comprising:
    a substrate;
    a plurality of heterojunction bipolar transistors formed on said substrate, each of said transistors including:
    a doped, semiconductive, collector contact layer formed in the surface of said semi-insulating substrate;
    a doped, collector layer including a semiconductive, electrically active region formed over and in contact with said doped, semiconductive, collector contact layer, and a semi-insulative, electrically inactive region abutting said electrically active region of said doped, collector layer said semi-insulative electrically inactive region of said collector layer, formed over and in contact with an undoped region of the semi-insulating substrate,
    a collector electrode formed over and in contact with of said collector contact layer;
    a semiconductive base layer including; a first electrically active region formed over said electrically active region of said collector layer, and a second electrically active region abutting said first electrically active region of said semiconductive base layer formed over and in contact with said semi-insulative electrically inactive region of said collector layer;
    a semiconductive emitter layer formed over and in contact with said first electrically active region of said base layer;
    a base electrode formed over and in contact with said second electrically active region of said base layer; and
    an emitter electrode formed over and in contact with said semiconductive emitter layer;
    an electrically conductive collector bus extending over and electrically interconnecting said electrically inactive regions of said collector contact layers of said transistors;

an electrically conductive base bus extending over and electrically interconnecting said emitter layers of said transistors;

the geometry of the collector, base and emitter busses being designed such that the phase velocity of an electromagnetic wave propagating along said busses has a substantially constant phase velocity.

17. A transistor as in claim 1, in which each transistor further comprises a ballast resistor layer formed between the emitter layer thereof and the emitter bus.

18. A doped semiconductive collector contact layer as in claim 16 wherein said electrically active region is conductive.

19. A doped semiconductive collector contact layer as in claim 16 wherein said electrically active region is capacitatively coupled to said base layer.

20. A doped, collector layer as in claim 16 wherein said semiconductive, electrically active region is conductive.

21. A doped, collector layer as in claim 16 wherein said semiconductive, electrically active region is capacitatively coupled to said base layer.

22. A semiconductive base layer as in claim 16, wherein said first electrically active region is conductive.

23. A semiconductive base layer as in claim 16, wherein said first electrically active region is capacitatively coupled to said collector contact layer.

24. A semiconductive base layer as in claim 16, wherein said second electrically active region is conductive.

25. A semiconductive base layer as in claim 16, wherein said second electrically active region is capacitatively coupled to said collector layer.

* * * * *